(12) United States Patent
Nichols

(10) Patent No.: US 7,679,423 B1
(45) Date of Patent: Mar. 16, 2010

(54) SWITCH CIRCUIT FOR MAGNETIC-INDUCTION INTERFACE

(75) Inventor: Kenneth R. Nichols, Fredericksburg, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 267 days.

(21) Appl. No.: 12/006,755

(22) Filed: Dec. 19, 2007

Related U.S. Application Data

(60) Provisional application No. 60/879,208, filed on Dec. 22, 2006.

(51) Int. Cl.
*H03K 17/00* (2006.01)
(52) U.S. Cl. .......................... 327/365; 327/376; 327/377
(58) Field of Classification Search .................. 327/308, 327/365, 376, 377, 403, 404; 326/23–27
See application file for complete search history.

(56) References Cited

U.S. PATENT DOCUMENTS

| | | | | |
|---|---|---|---|---|
| 5,385,476 A | | 1/1995 | Jasper | 439/38 |
| 5,831,718 A | | 11/1998 | Desai et al. | 356/5.01 |
| 5,892,387 A | * | 4/1999 | Shigehara et al. | 327/537 |
| 6,359,496 B1 | * | 3/2002 | Steinhagen | 327/391 |
| 6,492,897 B1 | * | 12/2002 | Mowery, Jr. | 455/522 |
| 6,819,013 B2 | | 11/2004 | Kelly et al. | 307/104 |
| 6,924,694 B2 | * | 8/2005 | Kinugasa et al. | 327/566 |
| 7,077,045 B2 | | 7/2006 | Dietrich et al. | 89/6 |
| 2002/0100809 A1 | | 8/2002 | Lu | 235/492 |
| 2006/0233605 A1 | | 10/2006 | Vendetti | 403/381 |

* cited by examiner

*Primary Examiner*—Hai L Nguyen
(74) *Attorney, Agent, or Firm*—Gerhard W. Thielman, Esq.; Oscar A. Towler, III Esq.

(57) ABSTRACT

A switch circuit is provided for conditional communication within a magnetic-induction interface, including first and second control nodes, a data input and output nodes, a parallel circuit, and first and second control nodes. The parallel circuit includes a pair of legs, each leg connecting to the data input and data output nodes. Each leg has a connector to a condition. Each control node is connected to the corresponding connector. The condition is one of the interface is connected and the interface is disconnected. The parallel circuit enables communication between the data input and output nodes only in response to the condition being that the interface is disconnected. The pair of leg includes first and second legs. The first leg includes a first MOSFET and a first diode. The first MOSFET has a first source, a first gate and a first drain. The second leg includes a second MOSFET and a second diode. The second MOSFET has a second source, a second gate and a second drain. The first and second diodes are connected to the data input node. The first and second sources are connected to the first and second diodes, respectively. The first and second gates are connected to the first and second control nodes, respectively. The first and second drains are connected to the data output node.

5 Claims, 2 Drawing Sheets

SWITCH CIRCUIT FOR MAGNETIC-INDUCTION INTERFACE

CROSS REFERENCE TO RELATED APPLICATION

Pursuant to 35 U.S.C. §119, the benefit of priority from provisional application 60/879,208, with a filing date of Dec. 21, 2006, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to a switch circuit for a magnetic-induction interface. In particular, magnetic-induction interfaces provide for data and/or power transmission between devices.

SUMMARY

Conventional switch circuits yield disadvantages addressed by various exemplary embodiments of the present invention. In particular, various exemplary embodiments provide a switch circuit that enables communication upon disconnection with the magnetic-inductance interface but not otherwise.

As such, the switch circuit provides for conditional communication within a magnetic-induction interface. In particular, this switch circuit includes first and second control nodes, a data input and output nodes, a parallel circuit, and first and second control nodes. The parallel circuit includes a pair of legs, each leg connecting to the data input and data output nodes. Each leg has a connector to a condition. Each control node is connected to the corresponding connector.

The condition is one of the interface is connected and the interface is disconnected. The parallel circuit enables communication between the data input and output nodes only in response to the condition being that the interface is disconnected. Specifically, the parallel circuit includes first and second legs. The first leg includes a first MOSFET and a first diode.

The first MOSFET has a first source, a first gate and a first drain. The second leg includes a second MOSFET and a second diode. The second MOSFET has a second source, a second gate and a second drain. The first and second diodes are connected to the data input node. The first and second sources are connected to the first and second diodes, respectively. The first and second gates are connected to the first and second control nodes, respectively. The first and second drains are connected to the data output node.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

Figure 1:
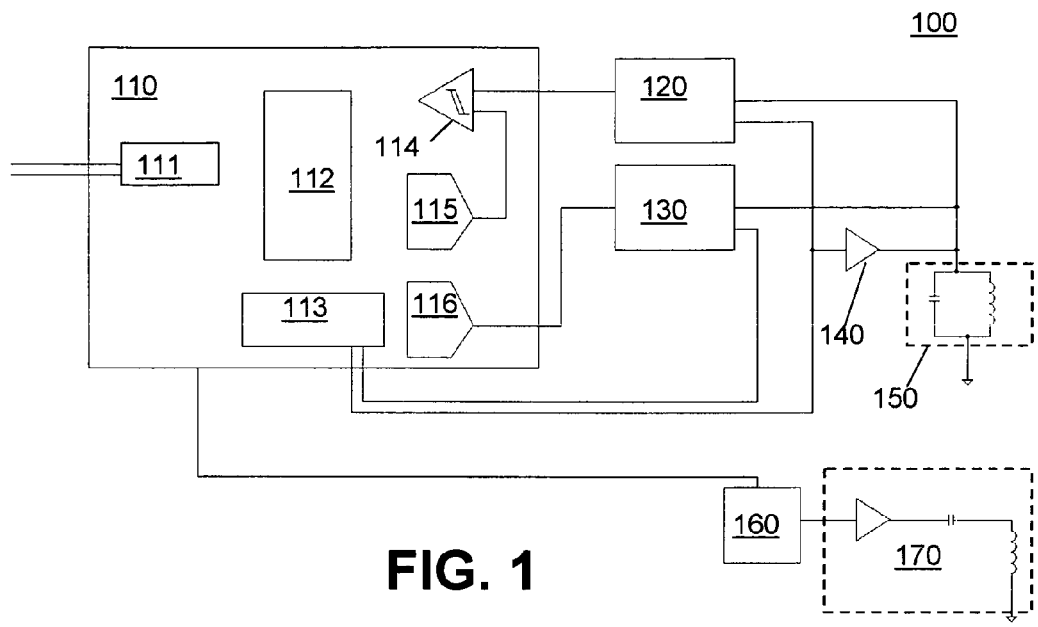
FIG. 1 is a block diagram view of a gyro-board.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Electrical power and data can be transferred between military instruments that have an appropriate interface employing magnetic-inductance. Such instruments (discussed in further detail for exemplary operations) may be used to serve specific functions whose information must be shared to satisfy intended objectives. Interfaces preferably enable expeditious mechanical connection and disconnection, with minimal operator attention devoted to initiate communication across the instruments.

The United States Marine Corps currently employs handheld laser range-finders for locating a selected target. These rangefinders use a digital magnetic compass to measure the earth's magnetic field to determine magnetic azimuth to provide a Marine the azimuth and range to the target. The rangefinder is connected to equipment that provides global positioning system (GPS) information, e.g., a Precision Lightweight GPS Receiver (PLGR), referred to as a "Receiver" herein. The range and azimuth measurements are passed to the Receiver (i.e., PLGR), which calculates the target's GPS position.

The azimuth measurement accuracy for the laser range finder is about seven milliradians, which provides a target position accuracy of 25-meter circular error of probability (CEP) at a range of five kilometers. This does not include the error from the difference between magnetic north and true north commonly quoted as being 0.5° (7.7 miles) earthwide. Inclusion of this error degrades target position accuracy by increasing uncertainty to 38-meter CEP at five kilometers.

Additionally, the magnetic compass is susceptible to changes in the earth's magnetic field caused by deposits of metal in the earth as well as vehicles, power lines, water pipes, etc. The Enhanced Targeting Acquisition and Location System (ETALS) eliminates the dependence on the Earth's magnetic field by incorporating a gyrocompass. One example of ETALS is a tripod-mounted system that uses a Miniature Azimuth Gyro-compassing Unit (MAGU) or "Gyro" to measure the earth's rotation thereby providing a true north measurement. This gyroscopic compass or Gyro may be shut off to conserve power after establishing the true north direction, thereupon an encoder is read to measure heading.

The Leica Vector™ 21 identified as E10487B AN/PEQ-21B is designated the Common Laser Range Finder (CLRF) or "Rangefinder" can accurately laze (i.e., illuminate by laser) a tank-sized target at ten kilometers. This Rangefinder (CLRF) is available from Vectronix Inc. in Leesburg, Va.

A dovetail mechanism designed to fit the Army's AN/PVS-6 MiniEye-Safe Laser Infrared Observation Set (MELIOS) rangefinder was used as an initial basis for the CLRF-to-MAGU interface. The subsequent dovetail mechanism has been designated the Dovetail Adaptable MAGU Interface (DAMI), referred to as "Dovetail Adaptor" herein.

Unlike MELIOS, the CLRF has an ergonomic contoured bottom that complicates proper alignment with the optical axis of the Rangefinder. Hence, the DAMI (i.e., Dovetail Adaptor) is designed to maintain the bore sight misalignment in non-volatile memory and transfer this information whenever the CLRF (i.e., Rangefinder) attaches to the MAGU (i.e., Gyro). The Dovetail Adaptor includes two circuit boards (range-board for the CLRF and gyro-board for the MAGU) and two halves of a transformer pair to inductively transfer data and power between the CLRF (i.e., Rangefinder) and the MAGU (i.e., Gyro).

The gyro-board (representing the Gyro-side of the Dovetail Adaptor) may detect proximity of and provide power to the range-board from the Gyro. The gyro-board also provides the main controller of the transformer interface. The gyro-board may transmit power and data signals to the range-board via two separate transformers, one each for communications and power. Each transformer consists of two halves with each half mounted in the Dovetail Adaptor.

Each circuit board includes a micro-controller unit (MCU). Each controller (i.e., MCU) contains an analog-to-digital converter (ADC), a digital-to-analog converter (DAC), a universal asynchronous receiver-transmitter (UART), random access memory (RAM), flash memory, timers and a Programmable Counter Array (PCA) or counter. Data transfer employs a parallel resonance arrangement to minimize the power consumption. In contrast, power transfer uses series resonance to maximize power transfer between the boards.

FIG. 1 shows a block diagram 100 of the gyro-board. The principle operations can be performed on a C8051F330 chip 110, which include a UART 111, an MCU 112, a PCA 113, a first amplifier 114, a DAC 115 and an ADC 116. An RS-232 port connected to the MAGU (i.e., Gyro) leads to the UART 111.

The PCA 113 connects to a detector 120 and a bipolar motor 130. The DAC 115 and the detector 120 connect to the amplifier 114 for determining the presence of the Rangefinder. The PCA 113 and the detector 120 connect to a second amplifier 140, which connects to a grounded parallel resistor-capacitor (RC) circuit 150. The detector 120 and the bipolar motor 130 also connect to the RC circuit 150. The chip 110 connects to an 8-pin oscillating 555-timer 160, which is in turn connected to a third amplifier in a series RC circuit 170.

Figure 2:
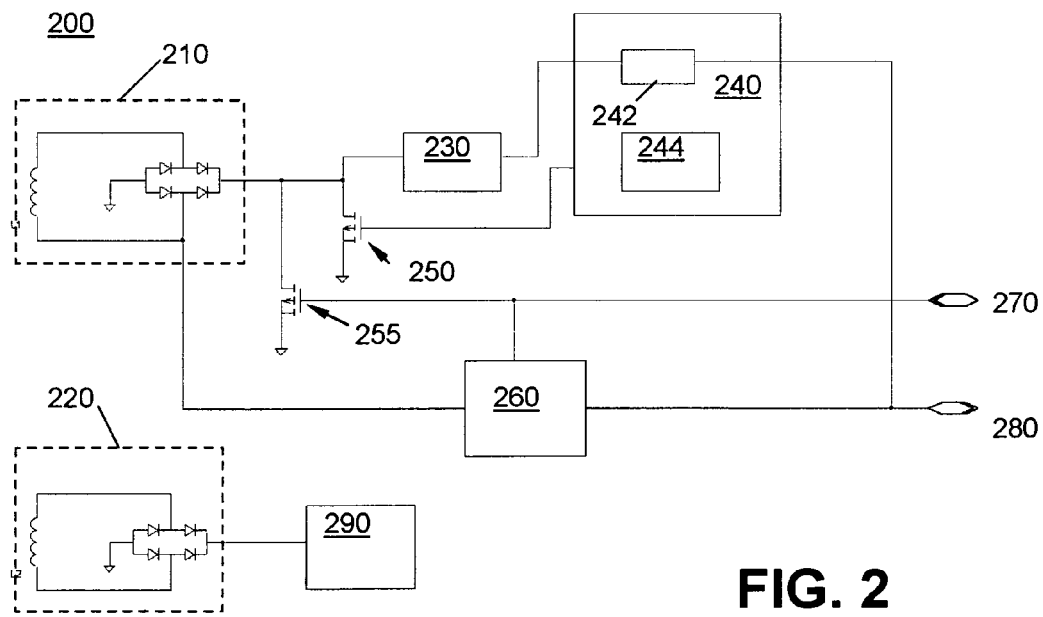
FIG. 2 is a block diagram view of a range-board.

FIG. 2 shows a block diagram 200 of the range-board (representing the Rangefinder-side of the Dovetail Adaptor). A data signal transformer 210 and a power transformer 220 provide magnetic coupling to the MAGU (e.g., Gyro) from which to respectively receive data and power. The data signal transformer 210 connects to a detector 230. Another C8051F330 chip 240 includes a UART 242 (connected to the detector 230) and an MCU 244.

The range-board further includes first and second devices 250 (designated U2-B) and 255 (designated U2-A) as well as a switch circuit 260. Each device represents a silicon p-channel metal-oxide semiconductor field-effect transistor (MOSFET). The first device 250 connects to the chip 240. The second device 255 connects in parallel to the switch circuit 260 to a first connector RS-232 port 270 to the CLRF (i.e., Rangefinder) directly. The UART 242 and the switch circuit 260 connect in parallel to a second connector RS-232 port 280 for the PLGR (i.e., Receiver). The power transformer 220 connects to a power supply 290.

The Rangefinder connects to the RS-232 port 280 to communicate with the Receiver. The range-board contains the switch circuit 260 to conditionally connect and disconnect data signals through the Receiver port 280 based on connectivity with the Rangefinder port 270.

The switch circuit 260 disconnects data signals through the Receiver port 280 during attachment of the Rangefinder to an operating Gyro, as the transformers provide this functionality. However, the switch circuit 260 enables the data signals to pass through the Receiver port 280 when either the Gyro is unpowered or else the Rangefinder is detached from the Gyro. Thus, the switch circuit 260 is open when powered and closed when unpowered.

Figure 3:
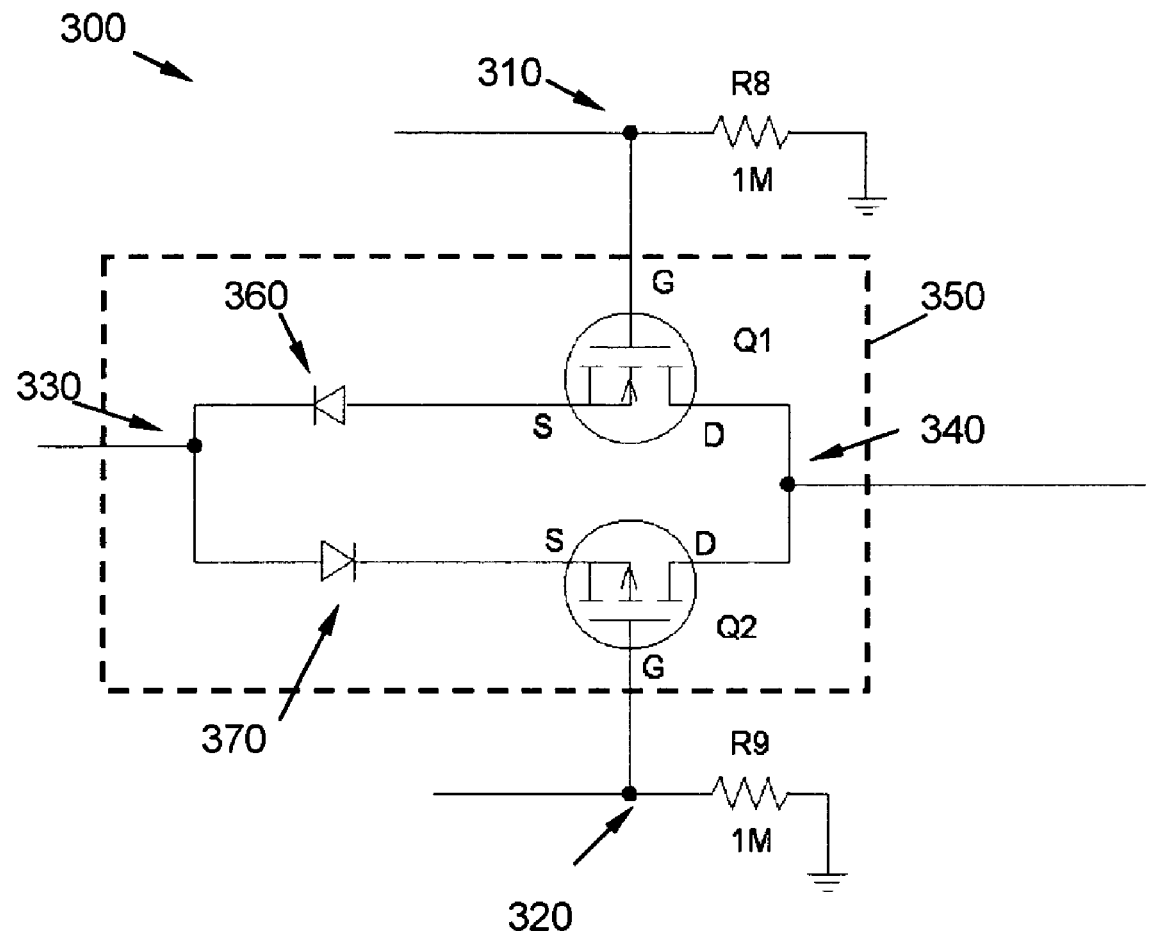
FIG. 3 is a block diagram view of a switch circuit.

FIG. 3 shows a block diagram 300 of the switch circuit 260. The diagram 300 provides first and second control nodes 310, 320 for reference voltage drop, along with input and output data nodes 330, 340 for RS-232 port signal transmission. The first control node 310 connects to reference of 0 volt during Rangefinder connection and −7±1 volts while the Rangefinder remains detached.

The first control node 310 attaches to a grounded R8 resistor having 1 MΩ. The second control node 320 connects to reference of +7±1 volts during Rangefinder connection and 0 volt while the Rangefinder remains detached. The second control node 320 attaches to a grounded R9 resistor having 1 MΩ.

A gated parallel circuit 350 is disposed between the input data node 330 and the output data node 340. Each small-signal device within the circuit 350 represents a MOSFET on each leg of a connection loop between the data nodes 330, 340. The first device is designated Q1, being a 2SK3064 silicon n-channel MOSFET. The second device is designated Q2, being a 2SJ0536 silicon p-channel MOSFET.

This gated circuit 350 includes a first diode 360 connected to a source (S) of Q1, and a second diode 370 connected to a source of Q2. The first and second diodes 360, 370 orient in directions respectively towards the data input and output nodes 330, 340. The gate (G) for Q1 connects to the first control node 310. The gate for Q2 connects to the second control node 320. The drain (D) for both devices Q1 and Q2 connect together at the output data node 340 that denotes the Receiver port 280. Artisans of ordinary skill will recognize alternate devices besides diodes and MOSFETs for the gated circuit 350 to accomplish the objectives described herein.

When the Rangefinder (i.e., CLRF) is disconnected from the Gyro (i.e., MAGU), the gate voltage $V_{gs}$ from the control nodes 310, 320 to the sources of Q1 and Q2 is 0 volt or ground. The signal voltage $V_{in}$ levels for standard RS-232 from the input data node 330 is +3 volts to +25 volts for logic-0 and −3 volts to −25 volts for logic-1, with typical values being about ±6 volts. The data input node 330 from the Rangefinder provides the following relations:

$$V_{in} = +6V \Rightarrow V_{gs} \text{ of } Q1 = -6V, \; Q1 \text{ is off}$$

$$V_{gs} \text{ of } Q2 = -6V, \; Q2 \text{ is on}$$

$$V_{in} = -6V \Rightarrow V_{gs} \text{ of } Q1 = +6V, \; Q1 \text{ is on}$$

$$V_{gs} \text{ of } Q2 = +6V, \; Q2 \text{ is off}$$

In this configuration with the same (non-zero) gate voltages for both devices Q1 and Q2, the switch circuit 260 passes the data through to the Receiver port 280. The first diode 360 blocks or passes the source of Q1 depending on whether the signal voltage is respectively negative or positive. Conversely, the second diode 370 passes or blocks the source of Q2 depending on whether the signal voltage is respectively negative or positive.

Upon connecting the Rangefinder to the Gyro, the range-board may receive a signal through the data transformer. A half-wave rectifier taps off a modest amount of power to produce a gate voltage of approximately ±6 volts: −6 volts for Q1 and +6 volts for Q2. The data input node 330 from the Rangefinder provides the following relations:

$$V_{in} = +6V \Rightarrow V_{gs} \text{ of } Q1 = -12V, \; Q1 \text{ is off}$$

$$V_{gs} \text{ of } Q2 = 0V, \; Q2 \text{ is off}$$

$$V_{in} = -6V \Rightarrow V_{gs} \text{ of } Q1 = 0V, \; Q1 \text{ is off}$$

$$V_{gs} \text{ of } Q2 = +12V, \; Q2 \text{ is off}$$

In this configuration with differing gate voltages for the devices Q1 and Q2, the switch circuit 260 blocks the data to the Receiver port 280. The 0 volt represents a set potential known as ground. In all these cases, both devices Q1 and Q2 have their gates blocked to prevent connection between the data input and output ports 330, 340.

For the devices used in the switch circuit 260, the gate voltage $V_{gs}$ can be +2 volts for the n-channel MOSFET Q1 and −2 volts for the p-channel MOSFET Q2 to insure that its gate turns on. Each of the diodes 360, 370 has a voltage drop of 0.410 volt on the source connection between the corresponding MOSFETs Q1 and Q2 and the input data node 330.

Thus, as long as the input signal remains within ±8.410 volts, the switch circuit 260 blocks data out to the Receiver port 280 represented by the data output node 340. However, if the input voltage $V_{in}$ drops below the gate voltage $V_{gs}$ by 2.410 volts or more, the switch circuit 260 does not block data to the Receiver port 280 represented by the data output node 340.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A switch circuit for conditional communication within a magnetic-induction interface, comprising:
    first and second control nodes;
    a data input node;
    a data output node;
    a parallel circuit having a pair of legs, each leg connecting to said data input and data output nodes, wherein said each leg has a connector to a condition; and
    first and second control nodes providing said condition, each control node connected to said corresponding connector, wherein
    said condition is one of the interface is connected and the interface is disconnected, and
    said parallel circuit enables communication between said data input and output nodes only in response to said condition being that the interface is disconnected.

2. The switch circuit according to claim 1, wherein
    said first and second control nodes are set to a fixed potential known as ground for said condition being the interface is disconnected,
    said first control node is −7±1 volts for said condition being the interface is connected, and
    said second control node is +7±1 volts for said condition being the interface is connected.

3. The switch circuit according to claim 1, wherein
    said parallel circuit comprises a first leg and a second leg,
    said first leg has a first MOSFET and a first diode, said first MOSFET having a first source, a first gate and a first drain,
    said second leg has a second MOSFET and a second diode, said second MOSFET having a second source, a second gate and a second drain,
    said first and second diodes are connected to said data input node,
    said first source is connected to said first diode,
    said second source is connected to said second diode,
    said first gate is connected to said first control node,
    said second gate is connected to said second control node, and
    said first and second drains are connected to said data output node.

4. The switch circuit according to claim 3, wherein
    said first MOSFET is an n-channel MOSFET, and
    said second MOSFET is a p-channel MOSFET.

5. The switch circuit according to claim 1, wherein the magnetic interface connects a Rangefinder to a Gyroscopic Compass.

* * * * *